United States Patent
Katou et al.

(10) Patent No.: US 11,640,991 B2
(45) Date of Patent: May 2, 2023

(54) SEMICONDUCTOR DEVICE AND METHOD FOR MANUFACTURING THE SAME

(71) Applicants: Kabushiki Kaisha Toshiba, Tokyo (JP); Toshiba Electronic Devices & Storage Corporation, Tokyo (JP)

(72) Inventors: Hiroaki Katou, Nonoichi Ishikawa (JP); Yasuhiro Kawai, Nonoichi Ishikawa (JP); Atsuro Inada, Nonoichi Ishikawa (JP); Toshifumi Nishiguchi, Hakusan Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 0 days.

(21) Appl. No.: 17/198,377

(22) Filed: Mar. 11, 2021

(65) Prior Publication Data
US 2022/0093789 A1  Mar. 24, 2022

(30) Foreign Application Priority Data

Sep. 18, 2020  (JP) .............. JP2020-157500

(51) Int. Cl.
*H01L 29/78* (2006.01)
*H01L 29/66* (2006.01)
*H01L 29/06* (2006.01)

(52) U.S. Cl.
CPC ...... *H01L 29/7813* (2013.01); *H01L 29/0607* (2013.01); *H01L 29/66712* (2013.01)

(58) Field of Classification Search
CPC ............ H01L 29/7813; H01L 29/0607; H01L 29/66712; H01L 29/407; H01L 29/66734;
(Continued)

(56) References Cited

U.S. PATENT DOCUMENTS 8,466,513 B2  6/2013  Grivna et al.
8,765,609 B2  7/2014  Parthasarathy et al.
(Continued)

FOREIGN PATENT DOCUMENTS

JP  2002-334997 A  11/2002
JP  2013-021077 A  1/2013
(Continued)

*Primary Examiner* — Cuong B Nguyen
(74) *Attorney, Agent, or Firm* — Allen & Overy LLP

(57) ABSTRACT

According to one embodiment, a semiconductor device includes a first electrode, first, second, and third semiconductor regions, an insulating portion, a conductive portion, a gate electrode, and a second electrode. The first semiconductor region is provided on the first electrode and electrically connected to the first electrode. The second semiconductor region is provided on the first semiconductor region. The third semiconductor region is provided on the second semiconductor region. The insulating portion are arranged with a portion of the first semiconductor region, and the second and third semiconductor regions. The conductive portion is provided inside the insulating portion and arranged with the first semiconductor region. The gate electrode is provided inside the insulating portion and arranged with the second semiconductor region. The second electrode is provided on the third semiconductor region and electrically connected to the third semiconductor region.

14 Claims, 8 Drawing Sheets

(58) Field of Classification Search
CPC ............. H01L 29/0649; H01L 29/0684; H01L 29/1037; H01L 29/7811; H01L 29/7825; H01L 29/66613–66628; H01L 29/42336; H01L 29/42352; H01L 29/4236; H01L 29/42356

See application file for complete search history.

(56) References Cited

U.S. PATENT DOCUMENTS

| | | | |
|---|---|---|---|
| 9,041,098 B2 * | 5/2015 | Ichinoseki | ........ H01L 29/42372 257/330 |
| 2016/0260808 A1 | 9/2016 | Kobayashi | |

FOREIGN PATENT DOCUMENTS

| | | |
|---|---|---|
| JP | 2015-529017 A | 10/2015 |
| JP | 2016-163019 A | 9/2016 |
| JP | 2017-216363 A | 12/2017 |

* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2020-157500, filed on Sep. 18, 2020; the entire contents of which are incorporated herein by reference.

FIELD

Embodiments described herein relate generally to a semiconductor device and a method for manufacturing the same.

BACKGROUND

A semiconductor device such as a metal-oxide-semiconductor field-effect transistor (MOSFET) is used in electric power conversion and the like. Semiconductor devices preferably have a low on-resistance.

DETAILED DESCRIPTION

Figure 1:
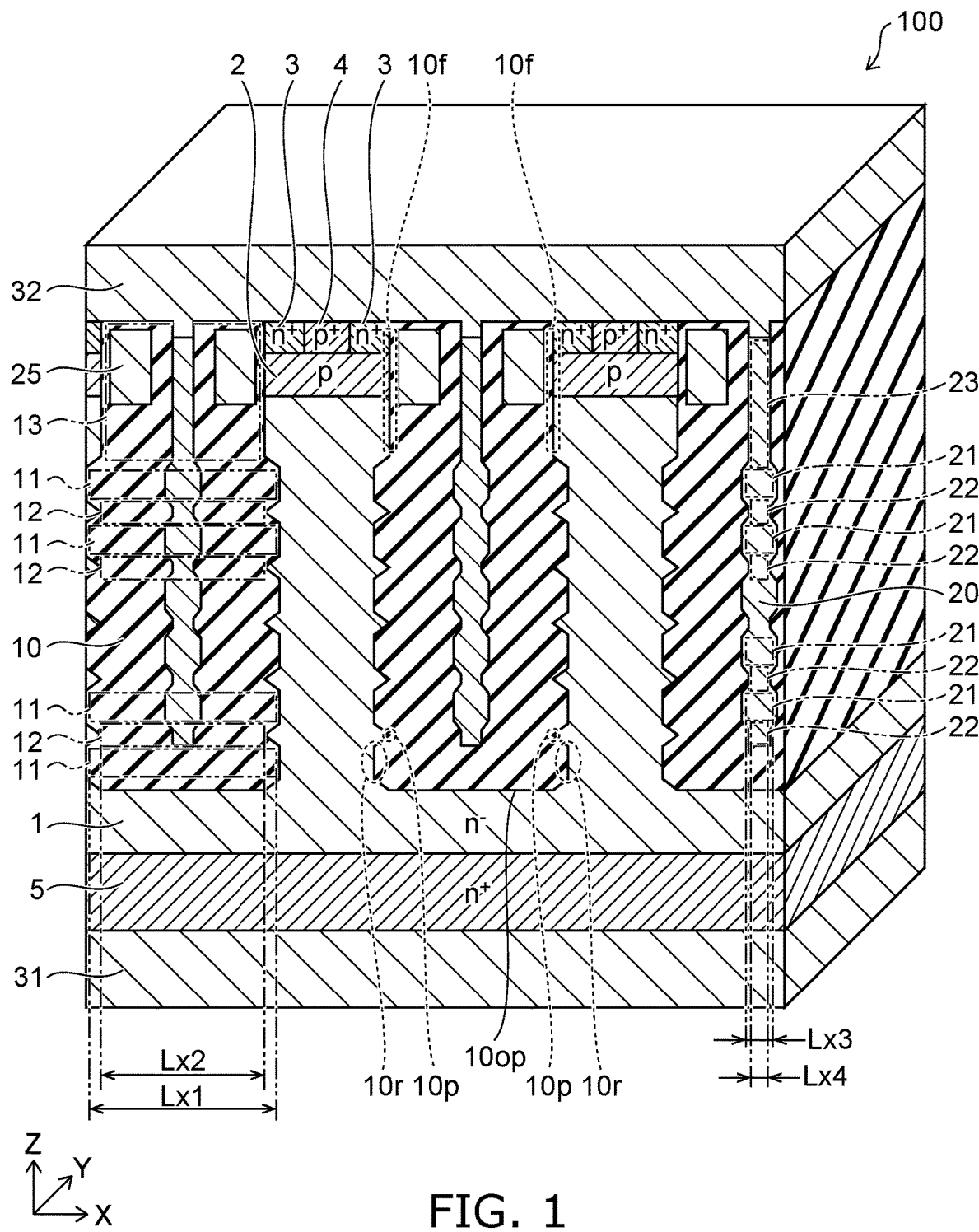
FIG. 1 is a perspective cross-sectional view illustrating a semiconductor device according to an embodiment.

According to one embodiment, a semiconductor device includes a first electrode, a first semiconductor region of a first conductivity type, a second semiconductor region of a second conductivity type, a third semiconductor region of the first conductivity type, an insulating portion, a conductive portion, a gate electrode, and a second electrode. The first semiconductor region is provided on the first electrode and electrically connected to the first electrode. The second semiconductor region is provided on the first semiconductor region. The third semiconductor region is provided on the second semiconductor region. The insulating portion are arranged with a portion of the first semiconductor region, the second semiconductor region, and the third semiconductor region in a second direction perpendicular to a first direction. The first direction is from the first electrode toward the first semiconductor region. The insulating portion includes a plurality of first insulating portions and a plurality of second insulating portions alternately provided in the first direction. Outer dimensions of the first insulating portions in the second direction are greater than outer dimensions of the second insulating portions in the second direction. The conductive portion is provided inside the insulating portion and arranged with the first semiconductor region in the second direction. The gate electrode is provided inside the insulating portion and arranged with the second semiconductor region in the second direction. The second electrode is provided on the third semiconductor region and electrically connected to the third semiconductor region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations of $n^+$, $n^-$ and $p^+$, $p^-$ represent relative high and low concentration of impurities. That is, the notation with "+" shows that the impurity concentration is relatively higher than the concentration of the notation without any of "+" and "−", and the notation with "−" shows that the impurity concentration is relatively lower than the concentration of the notation without any of them. These notations represent relative high and low concentration of net impurities after compensation of the impurities, when both of p-type impurity and n-type impurity are included in respective regions.

In the embodiments described later, the embodiments may be executed by inverting the p-type and the n-type in respective semiconductor regions.

FIG. 1 is a perspective cross-sectional view illustrating a semiconductor device according to an embodiment.

A semiconductor device 100 according to the embodiment is a MOSFET. As illustrated in FIG. 1, the semiconductor device 100 includes an $n^-$-type (first conductivity type) drift region 1 (first semiconductor region), a p-type (second conductivity type) base region 2 (second semiconductor region), an $n^+$-type source region 3 (third semiconductor region), a $p^+$-type contact region 4 (fourth semiconductor region), an $n^+$-type drain region 5 (fifth semiconductor region), an insulating portion 10, a conductive portion 20, a gate electrode 25, a drain electrode 31 (first electrode), and a source electrode 32 (second electrode).

The embodiment's will be described using an XYZ coordinate system. The direction from the drain electrode 31 toward the $n^-$-type drift region 1 is defined as the Z-direction (first direction). The direction perpendicular to the Z-direction is defined as the X-direction (second direction). The direction perpendicular to the X-direction and the Z-direction is defined as the Y-direction (third direction). Also, in the description, the direction from the drain electrode 31 toward the $n^-$-type drift region 1 is referred to as "up", and the opposite direction is referred to as "down". These directions are based on the relative positional relationship between the drain electrode 31 and the $n^-$-type drift region 1 and have no connection to the direction of gravity.

The drain electrode 31 is provided at the lower surface of the semiconductor device 100. The $n^+$-type drain region 5 is provided on the drain electrode 31 and is electrically connected to the drain electrode 31. The $n^-$-type drift region 1 is provided on the $n^+$-type drain region 5. The n-type impurity concentration in the $n^-$-type drift region 1 is lower than the n-type impurity concentration in the n⁺-type drain region 5. The n⁻-type drift region 1 is electrically connected to the drain electrode 31 via the n⁺-type drain region 5.

The p-type base region 2 is provided on the n⁻-type drift region 1. The n⁺-type source region 3 and the p⁺-type contact region 4 are provided on the p-type base region 2. The p-type impurity concentration in the p⁺-type contact region 4 is higher than the p-type impurity concentration in the p-type base region 2.

The insulating portion 10 is arranged with a portion of the n⁻-type drift region 1, the p-type base region 2, and the n⁺-type source region 3 in the X-direction. The conductive portion 20 is provided inside the insulating portion 10. At least a portion of the conductive portion 20 is arranged with the n⁻-type drift region 1 in the X-direction. The gate electrode 25 is arranged with the p-type base region 2 in the X-direction. The conductive portion 20 may be arranged with the gate electrode 25 in the X-direction.

The source electrode 32 is provided on the n⁺-type source region 3 and the p⁺-type contact region 4 and is electrically connected to the n⁺-type source region 3 and the p⁺-type contact region 4. The upper end of the conductive portion 20 is in contact with the source electrode 32, and the conductive portion 20 is electrically connected to the source electrode 32. The gate electrode 25 is electrically separated from the conductive portion 20 and the source electrode 32 by the insulating portion 10. Also, the conductive portion 20 may be in contact with the gate electrode 25 inside the insulating portion 10 and may be electrically connected to the gate electrode 25. In this case, the conductive portion 20 is electrically separate from the source electrode 32.

The insulating portion 10 includes a plurality of first insulating portions 11 and a plurality of second insulating portions 12 alternately provided in the Z-direction. An outer dimension Lx1 of the first insulating portions 11 in the X-direction is greater than an outer dimension Lx2 of the second insulating portions 12 in the X-direction.

In other words, the side wall of an opening 10op includes a plurality of recesses 10r and a plurality of protrusions 10p alternately provided in the Z-direction. The insulating portion 10 is provided inside the opening 10op. The recesses 10r are recessed along the X-Y plane from the insulating portion 10 toward the n⁻-type drift region 1. The protrusions 10p protrude along the X-Y plane from the n⁻-type drift region 1 toward the insulating portion 10. The dimension of the opening 10op in the X-direction at the position where the recess 10r is provided is greater than the dimension of the opening 10op in the X-direction at the position where the protrusion 10p are provided.

The insulating portion 10 further includes a third insulating portion 13. The third insulating portion 13 is provided on the plurality of first insulating portions 11 and the plurality of second insulating portions 12. The third insulating portion 13 is arrange with the p-type base region 2 and the n⁺-type source region 3 in the X-direction. The gate electrode 25 is provided inside the third insulating portion 13. The side wall of the third insulating portion 13 is parallel with the Z-direction.

A portion of the third insulating portion 13 is arranged with the p-type base region 2 in the X-direction. Another portion of the third insulating portion 13 is arranged with the n⁺-type source region 3 in the X-direction. An outer dimension of the portion of the third insulating portion 13 in the X-direction may be the same as an outer dimension of the other portion of the third insulating portion 13 in the X-direction. The outer dimension of the portion of the third insulating portion 13, the outer dimension of the other portion of the third insulating portion 13, and one of the outer dimensions of the second insulating portions 12 may be the same as each other.

The side wall of an opening 10op further includes a flat region 10f. The flat region 10f is provided above the recesses 10r and the protrusions 10p. The flat region 10f is parallel with the Z-direction. Therefore, the flat region 10f does not include a recess or a protrusion.

A portion of the flat region 10f is arranged with the p-type base region 2 in the X-direction. Another portion of the flat region 10f is arranged with the n⁺-type source region 3 in the X-direction. The dimension of the opening 10op in the X-direction at the position where the portion of the flat region 10f is provided may be the same as the dimension of the opening 10op in the X-direction at the position where the other portion of the flat region 10f is provided. The dimension of the opening 10op at the position where the portion of the flat region 10f is provided, the dimension of the opening 10op at the position where the other portion of the flat region 10f is provided, and one of the dimensions of the opening 10op at the positions where the protrusions 10p are provided may be the same as each other.

The conductive portion 20 includes a plurality of first conductive portions 21 and a plurality of second conductive portions 22 alternately provided in the Z-direction. A length Lx3 of the first conductive portions 21 in the X-direction is greater than a length Lx4 of the second conductive portions 22 in the X-direction. For example, the first insulating portions 11 are provided around the first conductive portions 21 in the X-Y plane (first plane). The second insulating portions 12 are provided around the second conductive portions 22 in the X-Y plane. The recesses 10r are provided around the first conductive portions 21 in the X-Y plane. The protrusions 10p are provided around the second conductive portions 22 in the X-Y plane.

The conductive portion 20 further includes a third conductive portion 23. The third conductive portion 23 is provided on the first conductive portions 21 and the second conductive portions 22. The third insulating portion 13 are provided around the third conductive portions 23 in the X-Y plane. At least a portion of the third conductive portion 23 is arranged with the gate electrode 25 in the X-direction. The flat regions 10f are provided around the third conductive portions 23 in the X-Y plane. At least a portion of the third conductive portion 23 is arranged with the gate electrode 25 in the X-direction.

For example, as illustrated in FIG. 1, a plurality of p-type base regions 2, a plurality of n⁺-type source regions 3, a plurality of p⁺-type contact regions 4, a plurality of insulating portions 10, a plurality of conductive portions 20, and a plurality of gate electrodes 25 are provided in the X-direction. Each p-type base region 2, each n⁺-type source region 3, each p⁺-type contact region 4, each insulating portion 10, each conductive portion 20, and each gate electrode 25 extends in the Y-direction. Between insulating portions 10 adjacent in the X-direction, in the n⁻-type drift region 1, a long portion with a relatively long length in the X-direction and a short portion with a relatively short length in the X-direction are alternately provided in the Z-direction.

The operation of the semiconductor device 100 will now be described.

With voltage that is positive with respect to the source electrode 32 being applied to the drain electrode 31, a voltage greater than a threshold is applied to the gate electrode 25. A channel (inversion layer) is formed in the p-type base region 2. This puts the semiconductor device 100 in the on state. In the on state, electrons flow to the drain electrode 31 through the channel and the n⁻-type drift region 1. Thereafter, when the voltage applied to the gate electrode 25 is less than the threshold, the channel in the p-type base region 2 disappears, and the semiconductor device 100 is put in the off state.

When the semiconductor device 100 is switched to the off state, a voltage which is positive with respect to the source electrode 32 to be applied to the drain electrode 31 increases. The electric potential between the drain electrode 31 and the conductive portion 20 cause the depletion layer to expand from the interface between the insulating portion 10 and the n⁻-type drift region 1 toward the n⁻-type drift region 1. The breakdown voltage of the semiconductor device 100 can be increased by the depletion layer expanding in this manner. Also, the breakdown voltage of the semiconductor device 100 can be maintained, the n-type impurity concentration in the n⁻-type drift region 1 can be increased, and the on-resistance of the semiconductor device 100 can be reduced.

Examples of the materials of the constituent elements of the semiconductor device 100 will now be described.

The n⁻-type drift region 1, the p-type base region 2, the n⁺-type source region 3, the p⁺-type contact region 4, and the n⁺-type drain region 5 include as semiconductor material silicon, silicon carbide, gallium nitride, or gallium arsenide. In a case where silicon is used as the semiconductor material, arsenic, phosphorus, or antimony can be used as the n-type impurity. Boron can be used as the p-type impurity. The insulating portion 10 includes an insulating material. The insulating portion 10 preferably includes an oxide or nitride insulating material. For example, the insulating portion 10 includes silicon oxide, silicon nitride, or silicon oxynitride. The conductive portion 20 and the gate electrode 25 include a conductive material such as polysilicon. An n-type or p-type impurity may be added to the conductive portion 20 and the gate electrode 25. The drain electrode 31 and the source electrode 32 include a metal, such as titanium, tungsten, or aluminum.

Figure 3A:
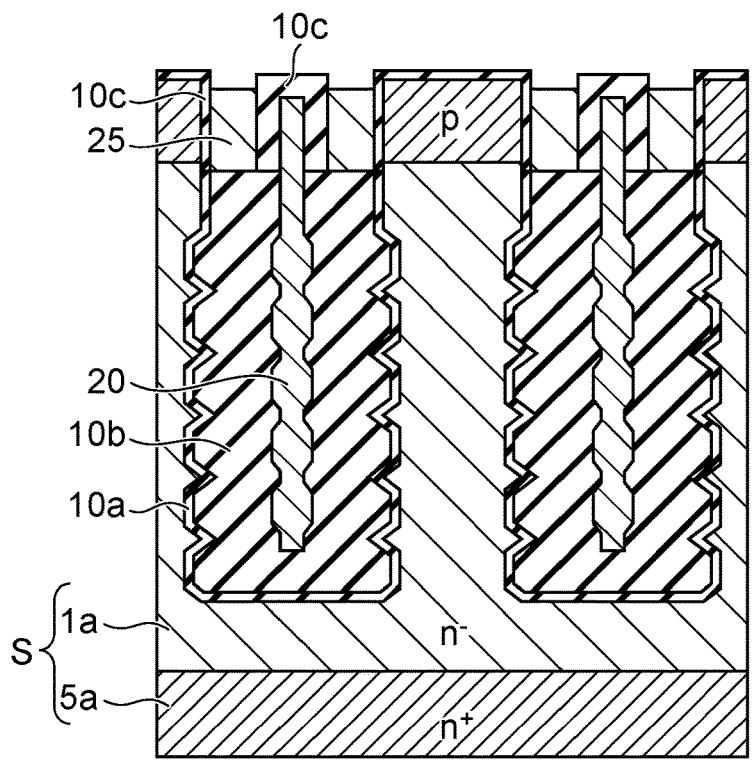
FIGS. 3A and 3B are cross-sectional views illustrating the process for manufacturing the semiconductor device according to the first embodiment.
Figure 3B:
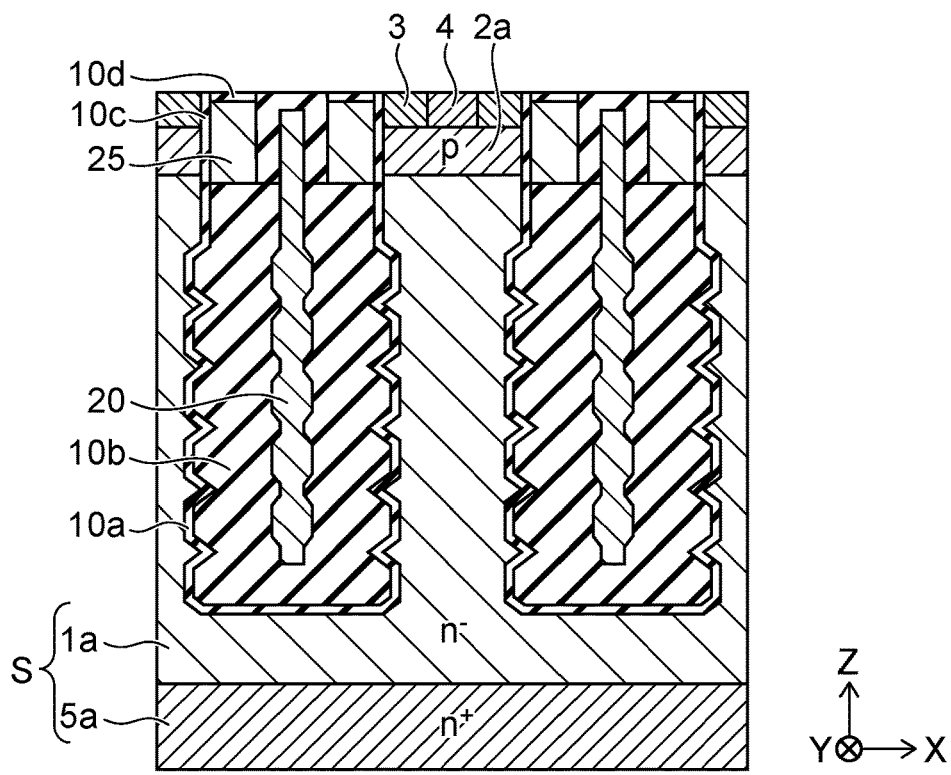
Figure 4:
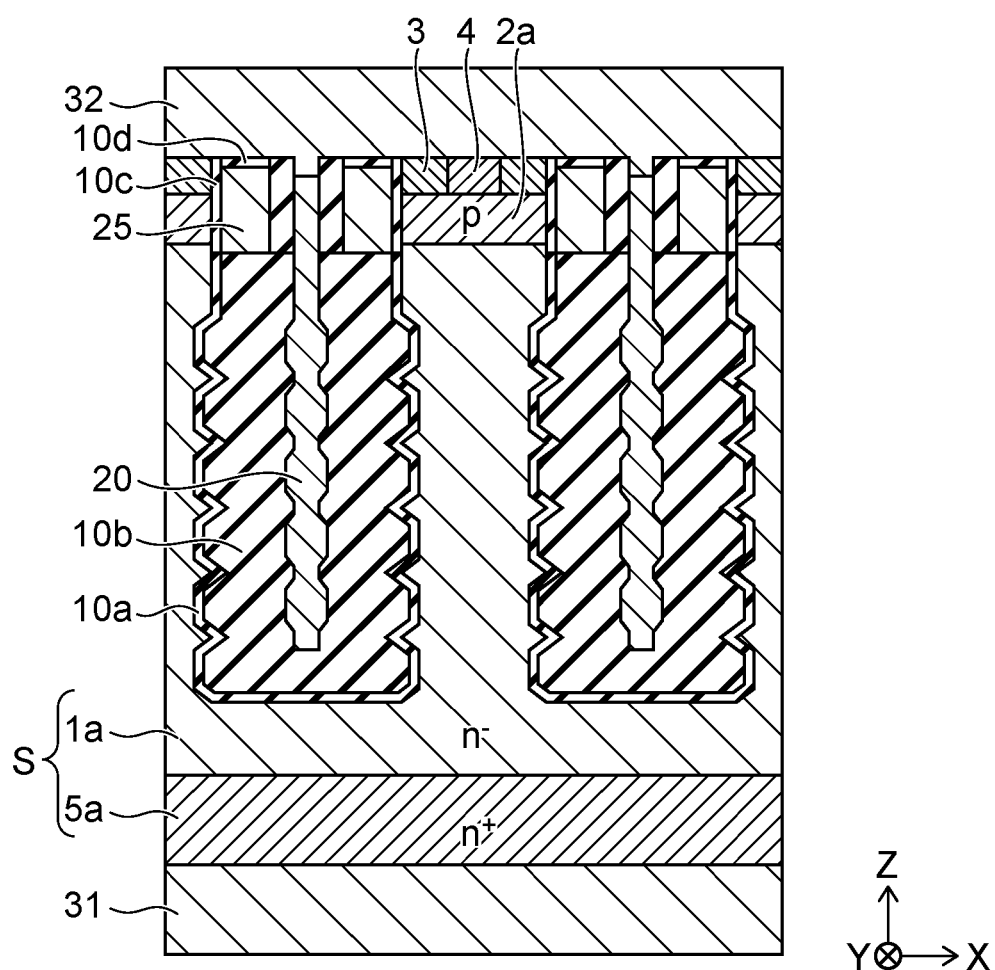
FIG. 4 is a cross-sectional view illustrating the process for manufacturing the semiconductor device according to the first embodiment.

FIGS. 2 to 4 are cross-sectional views illustrating a process for manufacturing a semiconductor device according to a first embodiment.

Figure 2A:
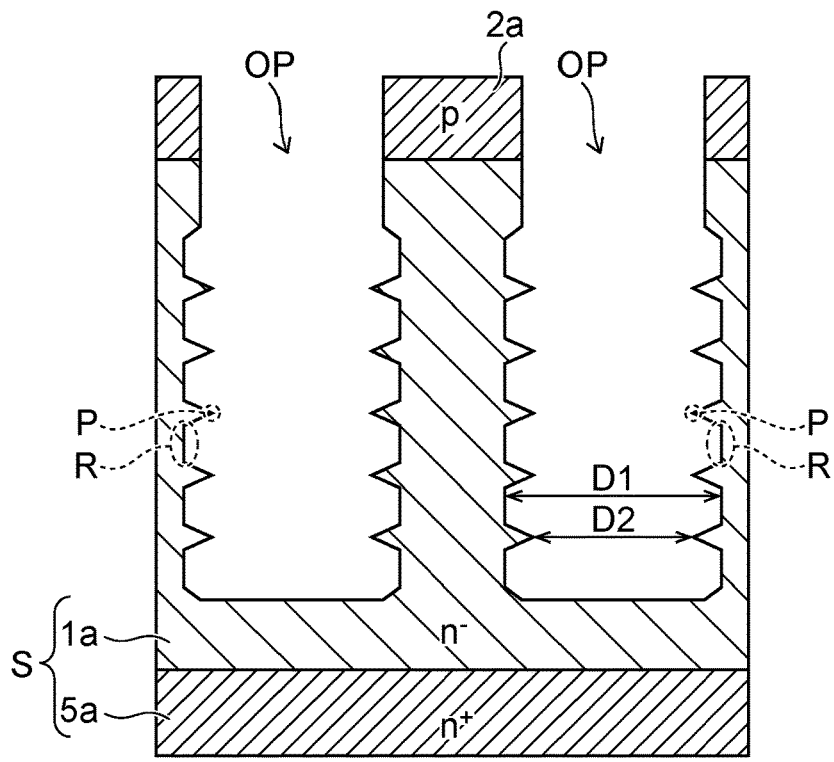
FIGS. 2A and 2B are cross-sectional views illustrating a process for manufacturing a semiconductor device according to the first embodiment.

A semiconductor substrate S that includes an n⁺-type semiconductor layer 5a and an n⁻-type semiconductor layer 1a is prepared. The semiconductor substrate S includes silicon. The n⁻-type semiconductor layer 1a is provided on the n⁺-type semiconductor layer 5a. p-type impurities are ion-injected on the upper surface of the n⁻-type semiconductor layer 1a, the p-type impurities are activated by heat treatment, and a p-type semiconductor region 2a is formed. The direction from the n⁻-type semiconductor layer 1a toward the p-type semiconductor region 2a is aligned with the Z-direction. A portion of the p-type semiconductor region 2a and a portion of the n⁻-type semiconductor layer 1a are removed, and, as illustrated in FIG. 2A, an opening OP is formed. A plurality of the openings OP are formed in the X-direction. Each opening OP extends in the Y-direction.

In forming the opening OP, first, an opening through the p-type semiconductor region 2a is formed by reactive-ion etching (RIE). Next, using the Bosch process, the n⁻-type semiconductor layer 1a of the bottom portion of the opening is removed. In the Bosch process, protective film formation, anisotropic etching, and isotropic etching are repeatedly executed. This forms, at a portion of the side wall of the opening OP, a plurality of recesses R and a plurality of protrusions P alternately provided in the Z-direction. The recesses R are recessed in the X-Y plane from the inner side of the opening OP toward the outer side. The protrusions P protrude in the X-Y plane from the outer side of the opening OP toward the inner side. A dimension D1 of the opening OP in the X-direction at the position where the recesses R are provided is greater than a dimension D2 of the opening OP in the X-direction at the position where the protrusions P are provided.

Figure 2B:
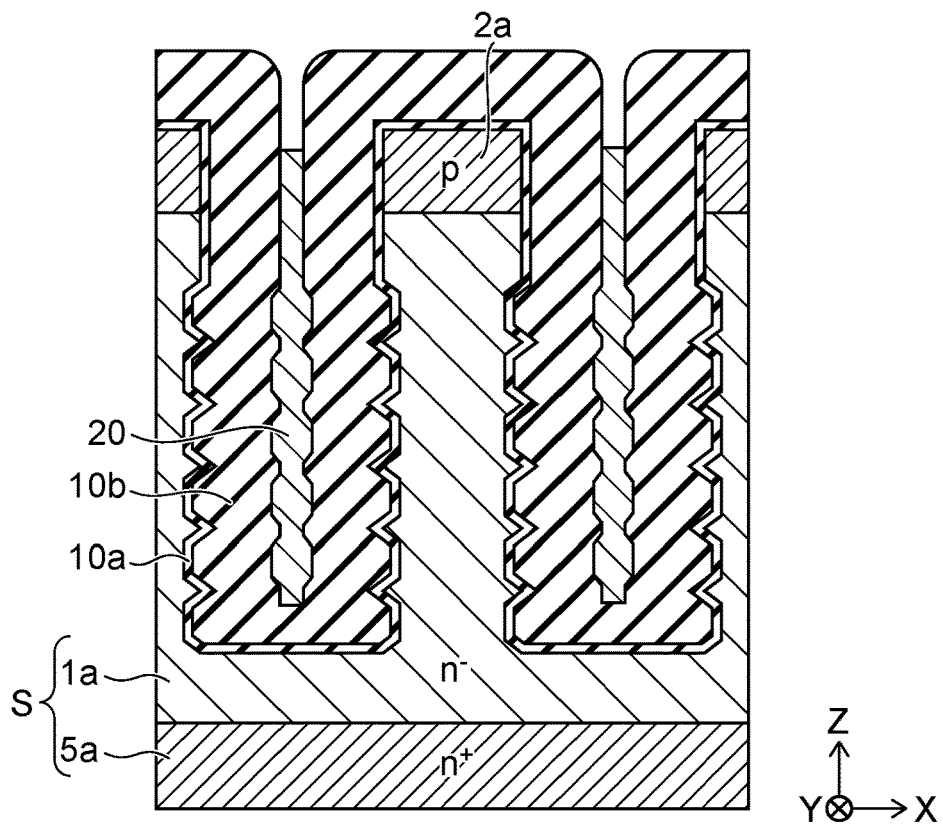

An insulating layer 10a is formed along the inner wall of the opening OP and the upper surface of the p-type semiconductor region 2a by thermal oxidation of the semiconductor substrate S. An insulating layer 10b is formed along the insulating layer 10a by chemical vapor deposition (CVD). The insulating layer 10b includes silicon oxide. Using CVD, a conductive layer that fits into the opening OP is formed on the insulating layer 10b. As illustrated in FIG. 2B, the upper surface of the conductive layer is retracted by chemical dry etching (CDE) or wet etching to form the conductive portion 20.

Inside the opening OP, the insulating layer 10a and the insulating layer 10b are formed with the portions with different outer dimensions in the X-direction alternately provided in the Z-direction. Portions of the insulating layer 10a and portions of the insulating layer 10b formed at the recess positions correspond to the first insulating portions 11. Other portions of the insulating layer 10a and the other portions of the insulating layer 10b formed at the protrusion positions correspond to the second insulating portions 12. Thermal oxidation is used to decrease the difference between the dimensions D1 and D2. The opening OP is formed so that the difference between the dimensions D1 and D2 is greater than the difference between the outer dimension of the first insulating portion 11 in the X-direction and the outer dimension of the second insulating portion 12 in the X-direction.

The upper portion of the insulating layer 10a and the upper portion of the insulating layer 10b located above the interface region of the n⁻-type semiconductor layer 1a and the p-type semiconductor region 2a are removed by CDE or wet etching. A portion of the n⁻-type semiconductor layer 1a and the p-type semiconductor region 2a are exposed. Using thermal oxidation, an insulating layer 10c is formed along the surface of the conductive portion 20, the surface of the n⁻-type semiconductor layer 1a, and the surface of the p-type semiconductor region 2a. A conductive layer is formed on the insulating layer 10c. The upper surface of the conductive layer is caused to recede by CDE or wet etching. In this manner, as illustrated in FIG. 3A, the gate electrode 25 is formed around the upper portion of the conductive portion 20.

n-type impurities and p-type impurities are sequentially ion-injected on the upper surface of the p-type semiconductor region 2a, the impurities are activated by heat treatment, and the n⁺-type source region 3 and the p⁺-type contact region 4 are formed. Using CVD, an insulating layer 10d is formed on the insulating layer 10c and the gate electrode 25. As illustrated in FIG. 3B, using chemical-mechanical polishing (CMP), the insulating layers 10c and 10d are grinded until the n⁺-type source region 3 and the p⁺-type contact region 4 are exposed.

Using RIE, a portion of the insulating layer 10c is removed, and the upper end of the conductive portion 20 is exposed. Using sputtering, the source electrode 32 is formed on the n⁺-type source region 3, the p⁺-type contact region 4, and the conductive portion 20. The lower surface of the n⁺-type semiconductor layer 5a is grinded down until the n⁺-type semiconductor layer 5a is a predetermined thickness. As illustrated in FIG. 4, using sputtering, the drain electrode 31 is formed on the lower surface of the n⁺-type semiconductor layer 5a. In this manner, the semiconductor device 100 according to an embodiment is manufactured.

The effects of an embodiment will now be described.

Tensile stress in the Z-direction preferably occurs in the n⁻-type drift region 1 located below the p-type base region 2. When tensile stress in the Z-direction occurs in the n⁻-type drift region 1, the lattice interval of the semiconductor material included in the n⁻-type drift region 1 expands. This improves the mobility of the carriers.

Figure 5A:
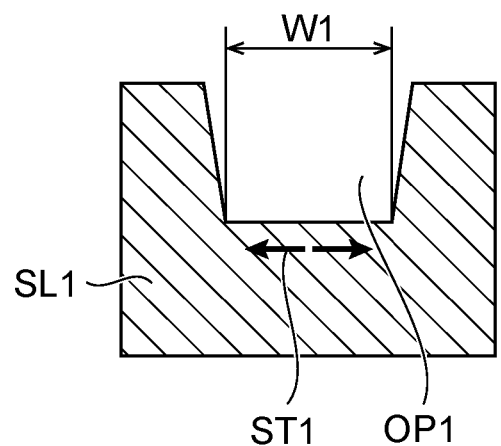
FIGS. 5A and 5B are cross-sectional views illustrating the shapes of the openings formed in the semiconductor layers.
Figure 5B:
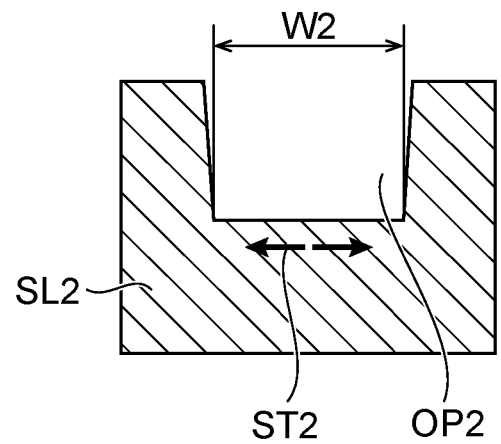

FIGS. 5A and 5B are cross-sectional views illustrating the shapes of the openings formed in the semiconductor layers.

FIG. 5A illustrates a semiconductor layer SL1 in which the opening OP1 is formed. FIG. 5B illustrates a semiconductor layer SL2 in which the opening OP2 is formed. The width of the upper end of the opening OP1 is the same as the width of the upper end of the opening OP2. The inclination of the side wall of the opening OP1 is greater than the inclination of the side wall of the opening OP2. Thus, a width W1 of the bottom portion of the opening OP1 is less than a width W2 of the bottom portion of the opening OP2.

The inventors discovered the following. When an insulating material is formed inside the opening OP1 and the opening OP2, the compressive stress of the insulating material inside the opening OP1 is greater than the compressive stress of the insulating material inside the opening OP2. Due to the insulating material inside the openings OP1 and OP2, tensile stress occurs in the semiconductor layers SL1 and SL2. A tensile stress ST1 in the semiconductor layer SL1 is greater than a tensile stress ST2 in the semiconductor layer SL2. When width of the opening is narrow, when the insulating material is formed inside the opening, a large tensile stress occurs in the semiconductor layer.

Figure 6:
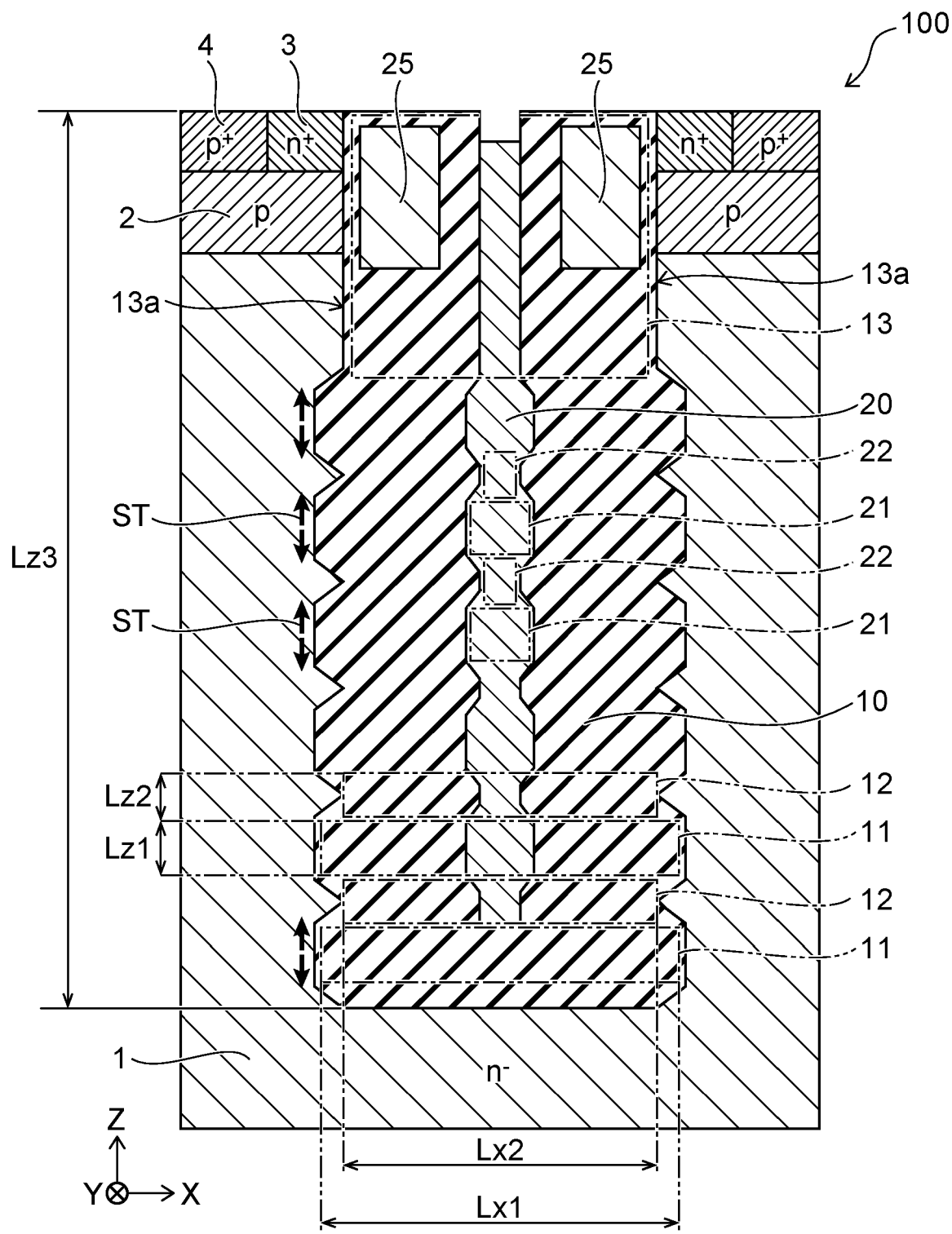
FIG. 6 is a cross-sectional view illustrating a portion of a semiconductor device according to an embodiment.

FIG. 6 is a cross-sectional view illustrating a portion of a semiconductor device according to an embodiment.

On the basis of the knowledge described above, the inventors formed the opening OP illustrated in FIG. 2A. A plurality of recesses and a plurality of protrusions are formed in the side wall of the opening OP. In other words, in the side wall, a plurality of openings with a smaller width than the opening OP are formed. By forming an insulating layer inside the opening OP, as illustrated in FIG. 6, the insulating portion 10 including the plurality of first insulating portions 11 and the plurality of second insulating portions 12 is formed.

At the outer circumference regions of the first insulating portions 11, a tensile stress ST in the Z-direction occurs in the n⁻-type drift region 1. When the semiconductor device 100 is in the on state, the carriers flow to the n⁻-type drift region 1 through the channel at the boundary region between the insulating portion 10 and the p-type base region 2. By the tensile stress ST in the Z-direction occurring in the n⁻-type drift region 1 near the insulating portion 10, the mobility of the carriers flowing to the n⁻-type drift region 1 is effectively improved. As a result, the on-resistance of the semiconductor device 100 is reduced.

To further increase the tensile stress ST occurring in the n⁻-type drift region 1, the insulating portion 10 preferably includes an oxide or a nitride. For example, the insulating portion 10 is formed using thermal oxidation or atomic layer deposition (ALD) of an oxide. Also, the insulating portion 10 may be formed by plasma CVD using monosilane, ammonia, and nitrogen gas. In this manner, the compressive stress on the insulating portion 10 can be further increased.

The first insulating portions 11 and the second insulating portions 12 may be provided at the position where the p-type base regions 2 are arranged with in the X-direction. Preferably, as illustrated in FIG. 6, the third insulating portion 13 is provided at the position where the p-type base regions 2 are arranged with in the X-direction. A side wall 13a of the third insulating portion 13 is parallel with the Z-direction.

For example, in a case where the first insulating portions 11 and the second insulating portions 12 are provided at the position where the p-type base regions 2 are arranged with in the X-direction, the boundary surface between the p-type base region 2 and the insulating portion 10 is bend in recesses and protrusions along the Z-direction. At the boundary surface of the p-type base region 2, an unintended surface orientation may appear, and a current path may occur on the boundary surface. In this manner, the leak current of the semiconductor device 100 may be increased. Also, by the channel formed in the p-type base region 2 being bent in recesses and protrusions, compared to a case where the channel is formed in the Z-direction, the channel length is longer. In this manner, the on-resistance of the semiconductor device 100 is increased.

By providing the third insulating portion 13, the surface orientation appearing in the boundary surface of the p-type base region 2 can be suppressed, and an increase in the leak current of the semiconductor device 100 can be suppressed. Also, because the channel length is formed in the Z-direction, an increase in the on-resistance of the semiconductor device 100 can be suppressed.

The first insulating portions 11 are preferably provided around the first conductive portions 21 in the X-Y plane. The second insulating portions 12 are provided around the second conductive portions 22 in the X-Y plane. According to this configuration, compared to a configuration in which the first insulating portions 11 are provided around the second conductive portions 22 and the second insulating portions 12 are provided around the first conductive portions 21, the difference can be decreased between the distance in the X-direction between the n⁻-type drift region 1 and the first conductive portions 21 and the distance in the X-direction between the n⁻-type drift region 1 and the second conductive portions 22. The difference can be decreased between, when the semiconductor device 100 is in the off state, the expansion of the depletion layer from the boundary between the first insulating portions 11 and the n⁻-type drift region 1 and the expansion of the depletion layer from the boundary between the second insulating portions 12 and the n⁻-type drift region 1. Accordingly, the breakdown voltage of the semiconductor device 100 can be improved.

The sum of a length Lz1 of a single first insulating portion 11 in the Z-direction and a length Lz2 of a single second insulating portion 12 in the Z-direction is greater than 0.1 times and less than 0.3 times a length Lz3 of the insulating portion 10 in the Z-direction. A length Lx2 of the second insulating portions 12 in the X-direction is greater than 0.7 times and less than 0.95 times a length Lx1 of the first insulating portions 11 in the X-direction.

Figure 7:
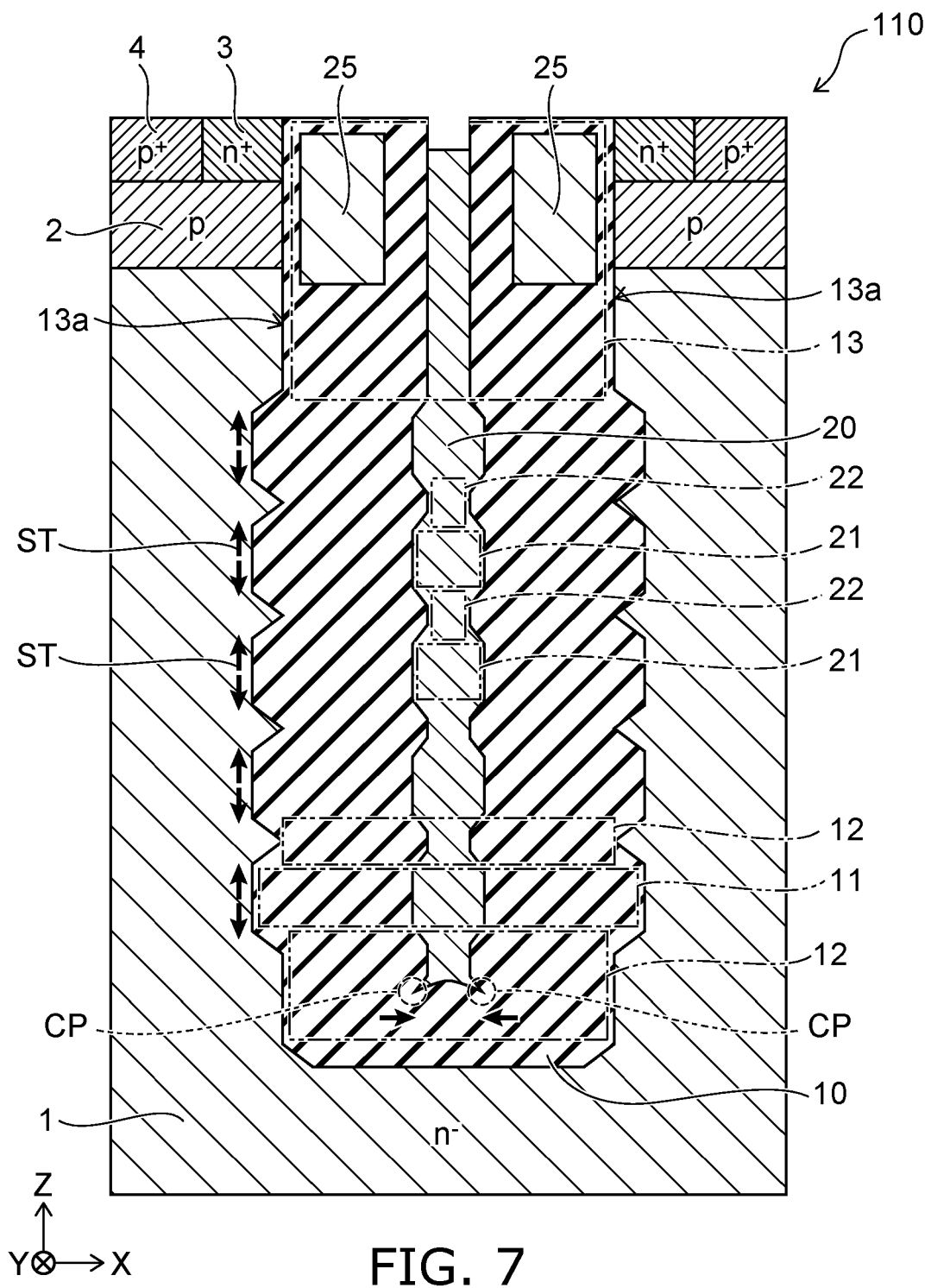
FIG. 7 is a cross-sectional view illustrating a portion of a semiconductor device according to another embodiment.
Figure 8:
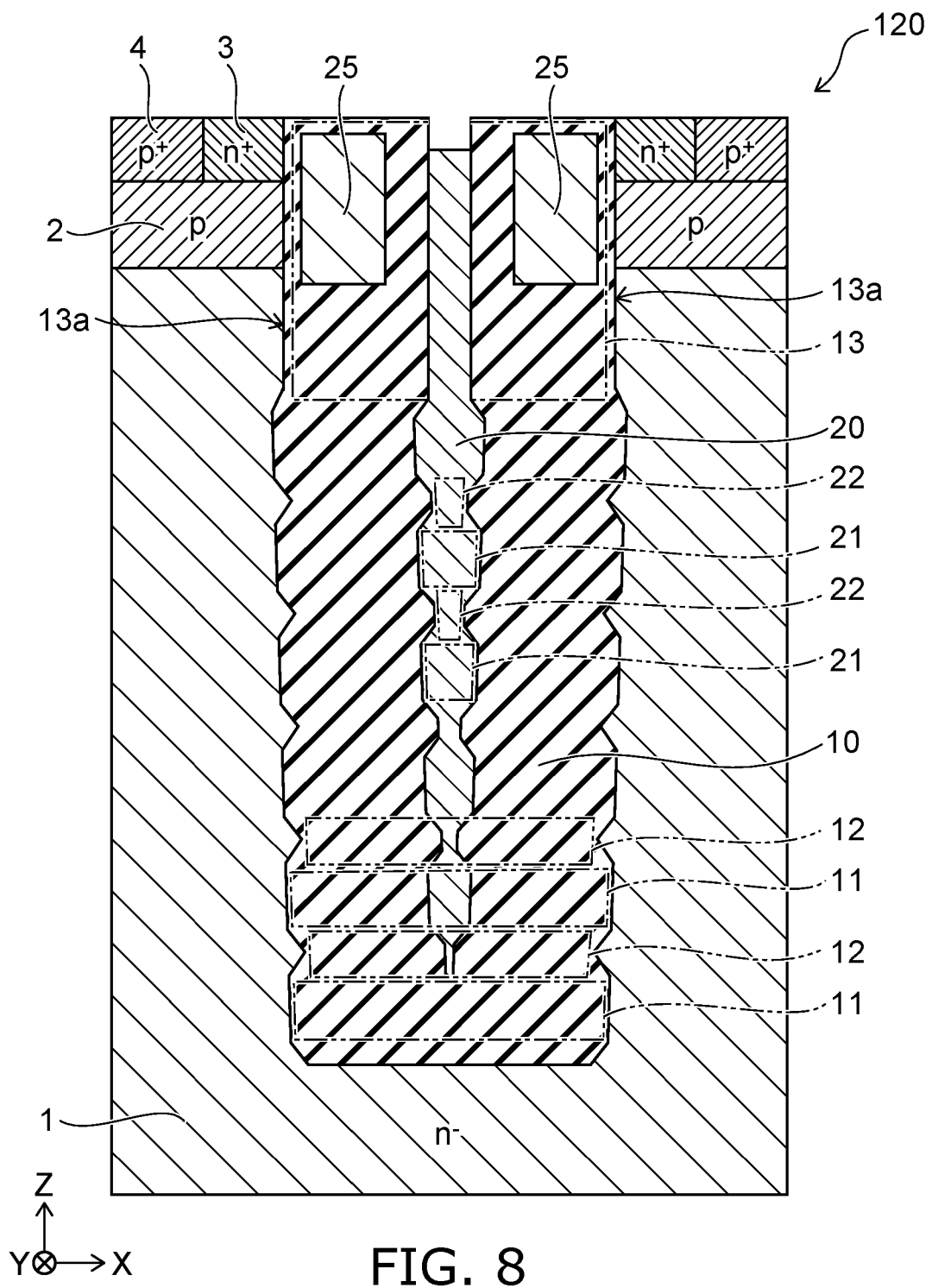
FIG. 8 is a cross-sectional view illustrating a portion of a semiconductor device according to another embodiment.

FIGS. 7 and 8 are cross-sectional views illustrating a portion of a semiconductor device according to another embodiment.

As in a semiconductor device 110 illustrated in FIG. 7, the first insulating portions 11 may not be provided below the conductive portion 20, and only the second insulating portions 12 may be provided. Preferably, as in the semiconductor device 100, one or more first insulating portions 11 are provided below the conductive portion 20.

By providing only the second insulating portions 12 below the conductive portion 20, below the conductive portion 20, the compressive stress in the X-direction occurring in the insulating portion 10 is increased. In this manner, tensile stress in the X-direction occurs in the lower end of the conductive portion 20. As a result, as illustrated in FIG. 7, a corner portion CP with a large curvature is formed in the lower end of the conductive portion 20. When the curvature of the corner portion CP is large, when voltage is applied between the n⁻-type drift region 1 and the conductive portion 20, the electric field intensity near the corner portion CP is increased. This increases the likelihood of insulation failure near the corner portion CP occurring and the semiconductor device 100 failing.

By providing one or more first insulating portions 11 below the conductive portion 20, the compressive stress of the insulating portion 10 below the conductive portion 20 can be reduced. In this manner, the curvature of the corner portion CP can be decreased, and the likelihood of the semiconductor device 100 failing can be reduced.

In a semiconductor device 120 illustrated in FIG. 8, the width (length in the X-direction) of a single first insulating portion 11 is less than the width of another single first insulating portion 11. The single first insulating portion 11 is located below the other single first insulating portion 11.

In a similar manner, the width of a single second insulating portion 12 is less than the width of another single second insulating portion 12. The single second insulating portion 12 is located below the other single second insulating portion 12.

The widths of the first insulating portions 11 and the widths of the second insulating portions 12 decrease going down. Accordingly, the width of the n⁻-type drift region 1 between adjacent insulating portions 10 is greater going down.

When the semiconductor device 120 is switched from the on state to the off state, a depletion layer expands from the p-n junction between the n⁻-type drift region 1 and the p-type base region 2. When the width of the n⁻-type drift region 1 is greater going down, the amount of n-type impurities included in the n⁻-type drift region 1 also increases going down. Thus, the more the depletion layer expands going down, the more the speed of the depletion layer expansion is reduced. For example, regarding the relationship between a voltage Vds of the drain electrode 31 with respect to the source electrode 32 and an output capacity Coss, the change in the output capacity Coss with respect to the voltage Vds is gentle. As a result, noise caused when the semiconductor device 120 is switched to the off state can be reduced.

Also, the width of a single first conductive portion 21 is less than the width of another single first conductive portion 21. The single first conductive portion 21 is located below the other single first conductive portion 21.

The width of a single second conductive portion 22 is less than the width of another single second conductive portion 22. The single second conductive portion 22 is located below the other single second conductive portion 22.

For example, the widths of the first conductive portions 21 and the widths of the second conductive portions 22 decrease going down.

Accordingly, compared to a case where the widths of the first conductive portions 21 and the widths of the second conductive portions 22 are constant in the Z-direction, the thickness of the insulating portion 10 in the X-direction between the n⁻-type drift region 1 and the conductive portion 20 can be suppressed from changing in the Z-direction. For example, the thickness of the insulating portion 10 at the lower portion of the insulating portion 10 can be made thin, allowing insulation failure to be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A semiconductor device, comprising:
    a first electrode;
    a first semiconductor region of a first conductivity type provided on the first electrode and electrically connected to the first electrode;
    a second semiconductor region of a second conductivity type provided on the first semiconductor region;
    a third semiconductor region of the first conductivity type provided on the second semiconductor region;
    an insulating portion being arranged with a portion of the first semiconductor region, the second semiconductor region, and the third semiconductor region in a second direction perpendicular to a first direction, the first direction being from the first electrode toward the first semiconductor region, the insulating portion including a plurality of first insulating portions and a plurality of second insulating portions alternately provided in the first direction, and outer dimensions of the plurality of first insulating portions in the second direction being greater than outer dimensions of the plurality of second insulating portions in the second direction;
    a conductive portion provided inside the insulating portion and arranged with the first semiconductor region in the second direction;
    a gate electrode provided inside the insulating portion and arranged with the second semiconductor region in the second direction; and
    a second electrode provided on the third semiconductor region and electrically connected to the third semiconductor region.

2. The device according to claim 1, wherein
    the insulating portion further includes a third insulating portion provided above the plurality of first insulating portions and the plurality of second insulating portions,
    a side surface of the third insulating portion is parallel with the first direction, and
    the gate electrode is provided inside the third insulating portion.

3. The device according to claim 2, wherein
    a portion of the third insulating portion is arranged with the second semiconductor region in the second direction,
    another portion of the third insulating portion is arranged with the third semiconductor region in the second direction, and
    an outer dimension of the portion of the third insulating portion in the second direction is the same as an outer dimension of the other portion of the third insulating portion in the second direction.

4. The device according to claim 3, wherein the outer dimension of the portion of the third insulating portion, the outer dimension of the other portion of the third insulating portion, and one of the outer dimensions of the second insulating portions are the same as each other.

5. The device according to claim 1, wherein
one or more of the plurality of first insulating portions is provided below the conductive portion.

6. The device according to claim 1, wherein
the conductive portion includes a plurality of first conductive portions and a plurality of second conductive portions alternately provided in the first direction,
a length of the plurality of first conductive portions in the second direction is greater than a length of the second conductive portions in the second direction,
the plurality of first insulating portions are provided around the plurality of first conductive portions in a first plane perpendicular to the first direction, and
the plurality of second insulating portions are provided around the plurality of second conductive portions in the first plane.

7. The device according to claim 1, wherein
one of the plurality of first insulating portions is located below another one of the plurality of first insulating portions, and
an outer dimension of the one of the plurality of first insulating portions in the second direction is less than an outer dimension of the other one of the plurality of first insulating portions in the second direction.

8. A semiconductor device, comprising:
a first electrode,
a first semiconductor region of a first conductivity type provided on the first electrode and electrically connected to the first electrode,
a second semiconductor region of a second conductivity type provided on the first semiconductor region,
a third semiconductor region of the first conductivity type provided on the second semiconductor region,
an opening being arranged with a portion of the first semiconductor region, the second semiconductor region, and the third semiconductor region in a second direction perpendicular to a first direction, the first direction being from the first electrode toward the first semiconductor region, a side wall of the opening including a plurality of recesses and a plurality of protrusions alternately provided in the first direction, each one of the plurality of recesses being recessed from the opening toward the first semiconductor region in the second direction, and each one of the plurality of protrusions protruding from the first semiconductor region toward the opening in the second direction,
a conductive portion provided inside the opening with an insulating portion interposed, and being arranged with the first semiconductor region in the second direction,
a gate electrode provided inside the opening with the insulating portion interposed, and being arranged with the second semiconductor region in the second direction, and
a second electrode provided on the third semiconductor region and electrically connected to the third semiconductor region.

9. The device according to claim 8, wherein
a dimension of the opening in the second direction at a position where one of the plurality of recesses is provided is greater than a dimension of the opening in the second direction at a position where one of the plurality of protrusions is provided.

10. The device according to claim 8, wherein
the side wall further includes a flat region provided above the recesses and the protrusions,
the flat region is parallel with the first direction, and
the gate electrode faces the flat region in the second direction.

11. The device according to claim 10, wherein
a portion of the flat region is arranged with the second semiconductor region in the second direction,
another portion of the flat region is arranged with the third semiconductor region in the second direction, and
a dimension of the opening in the second direction at a position where the portion of the flat region is provided is the same as a dimension of the opening in the second direction at a position where the other portion of the flat region is provided.

12. The device according to claim 11, wherein
the dimension of the opening at the position where the one of the plurality of protrusions is provided are the same as each other.

13. The device according to claim 8, wherein
one or more of the plurality of recesses is provided below the conductive portion.

14. The device according to claim 8, wherein
the conductive portion includes a plurality of first conductive portions and a plurality of second conductive portions alternately provided in the first direction,
a length of the first conductive portions in the second direction is greater than a length of the second conductive portions in the second direction,
the plurality of recesses are provided around the plurality of first conductive portions in a first plane perpendicular to the first direction, and
the plurality of protrusions are provided around the plurality of second conductive portions in the first plane.

* * * * *